United States Patent
Liu et al.

(10) Patent No.: US 11,472,973 B2
(45) Date of Patent: Oct. 18, 2022

(54) UV-LED DIELECTRIC INK FOR PRINTED ELECTRONICS APPLICATIONS

(71) Applicant: SUN CHEMICAL CORPORATION, Parsippany, NJ (US)

(72) Inventors: Ying Liu, Aurora, IL (US); Erika Rebrosova, West Chicago, IL (US); Nandakumar Menon, Aurora, IL (US)

(73) Assignee: Sun Chemical Corporation, Parsippany, NJ (US)

( * ) Notice: Subject to any disclaimer, the term of this patent is extended or adjusted under 35 U.S.C. 154(b) by 246 days.

(21) Appl. No.: 16/477,992

(22) PCT Filed: Jan. 17, 2018

(86) PCT No.: PCT/US2018/013993
§ 371 (c)(1),
(2) Date: Jul. 15, 2019

(87) PCT Pub. No.: WO2018/136480
PCT Pub. Date: Jul. 26, 2018

(65) Prior Publication Data
US 2020/0283649 A1 Sep. 10, 2020

Related U.S. Application Data

(60) Provisional application No. 62/447,593, filed on Jan. 18, 2017.

(51) Int. Cl.
| | | |
|---|---|---|
| C09D 11/00 | (2014.01) |
| C08F 2/46 | (2006.01) |
| C08F 2/50 | (2006.01) |
| C08G 61/04 | (2006.01) |
| C09D 11/101 | (2014.01) |
| C09D 11/107 | (2014.01) |
| C09D 11/38 | (2014.01) |
| C09D 11/52 | (2014.01) |
| H05K 1/09 | (2006.01) |

(52) U.S. Cl.
CPC .......... C09D 11/101 (2013.01); C09D 11/107 (2013.01); C09D 11/38 (2013.01); C09D 11/52 (2013.01); H05K 1/095 (2013.01)

(58) Field of Classification Search
CPC ..... H05K 1/095; C08F 265/06; C08F 220/30; C08F 222/1065; C09D 11/52; C09D 11/101; C09D 11/38; C09D 11/107; C09D 4/06
USPC .... 522/6, 71, 189, 184, 1; 106/31.92, 31.13, 106/31.01; 520/1
See application file for complete search history.

(56) References Cited

U.S. PATENT DOCUMENTS

| | | | | |
|---|---|---|---|---|
| 4,789,625 A * | 12/1988 | Ellerstein | ............... | C08F 299/06 430/372 |
| 10,941,308 B2 * | 3/2021 | Pickrell | ................. | B41M 7/0045 |
| 2002/0004537 A1 * | 1/2002 | Krongauz | ............ | C08F 290/147 522/90 |
| 2005/0101685 A1 * | 5/2005 | Krohn | .................... | H01L 21/312 522/71 |
| 2009/0186163 A1 * | 7/2009 | Umebayashi | ........... | C09D 11/38 427/511 |
| 2012/0058317 A1 | 3/2012 | Seung et al. | | |
| 2012/0189822 A1 * | 7/2012 | Ito | .......................... | C09D 11/101 428/195.1 |
| 2012/0196122 A1 * | 8/2012 | Bishop | .................. | C03C 25/622 428/392 |
| 2014/0151606 A1 | 6/2014 | Lowenthal et al. | | |
| 2014/0151607 A1 * | 6/2014 | Lowenthal | ............. | C09D 11/52 252/503 |
| 2016/0312051 A1 * | 10/2016 | Clayton | ................ | C09D 11/101 |
| 2016/0340529 A1 * | 11/2016 | Lawrence | ............... | C09D 11/30 |
| 2017/0107386 A1 * | 4/2017 | Herlihy | ..................... | C08F 2/50 |

FOREIGN PATENT DOCUMENTS

| | | | |
|---|---|---|---|
| CN | 103045007 A | 6/2014 | |
| CN | 104497697 A | 4/2015 | |
| CN | 104559459 A | 10/2016 | |
| CN | 102 732 094 A | 10/2017 | |
| JP | 5564788 B2 | 8/2014 | |
| JP | 2015010113 A | 1/2015 | |
| WO | WO-2016178989 A1 * | 11/2016 | ............. C09D 11/38 |
| WO | WO-2018022584 A1 * | 2/2018 | .......... B41M 7/0081 |

OTHER PUBLICATIONS

International Search Report issued in International Application No. PCT/US18/13993/, dated Mar. 8, 2018.
Written Opinion of the International Searching Authority issued in International Application No. PCT/US18/13993/, dated Mar. 8, 2018.
Jovic, M et al., Inkjet-printed microtiter plates for portable electrochemical immunoassays. Journal of Electroanalytical chemistry, vol. 786, pp. 69-76. Jan. 4, 2017; abstract: pp. 69-70 US 2014/0151606 A1 (NTH Degree Tehnologies Worldwide Inc.) Jun. 5, 2014.
Chinese Office Action issued in counterpart CN Application No. 201880007398.8, dated Oct. 21, 2021.
Chinese Office Action issued in counterpart CN Application No. 201880007398.8, dated Apr. 22, 2022.
Supplementary European Search Report issued in counterpart EP Application No. 18741930.4, dated Oct. 7, 2020.
Supplementary European Search Report issued in counterpart EP Application No. 18741930.4, dated Jan. 28, 2021.

* cited by examiner

*Primary Examiner* — Jessica Whiteley
(74) *Attorney, Agent, or Firm* — Marian E. Fundytus; Ostrolenk Faber LLP

(57) ABSTRACT

The present invention provides a screen printable UV-LED curable, dielectric ink composition for printed electronics applications.

19 Claims, No Drawings

UV-LED DIELECTRIC INK FOR PRINTED ELECTRONICS APPLICATIONS

The present application is a § 371 National Stage application based on PCT/US2018/013993 filed Jan. 17, 2018, which claims the benefit of U.S. Provisional Application No. 62/447,593, filed Jan. 18, 2017, the subject matter of each of which is incorporated by reference in their entirety.

FIELD OF THE INVENTION

The inventions disclosed herein are directed to the field of printed electric components and in particular to dielectric inks and coating compositions that can be printed onto the electric component structure, such as by screen printing, and cured by exposure to energy emitted by UV-LED sources, among other possible energy sources.

BACKGROUND OF THE INVENTION

UV-curable PTF dielectric inks are used to protect and insulate electrical components in printed electronics, such as printed circuit boards. These inks can be used in making multilayer circuits in which conductive ink layers are printed below, above, and/or below and above the printed dielectric ink layers. As arranged in this way, the printed electronic component possesses reliable crossover circuitry.

Currently available PTF dielectrics for printed electronics applications are cured with mercury-based UV lamps. These lamps are used predominately in this industry. However, mercury-based UV lamps have significant disadvantages. These lamps consume a lot of energy and thus are not energy efficient. Further, they generate a lot of heat, which prevents the use of heat sensitive substrates. Such lamps also present environmental hazards in that they generate ozone and can cause mercury contamination.

Curing with ultraviolet light emitting diode (UV-LED) light sources is making its way into multiple graphic printing ink sectors. UV-LED curing technology has some advantages in that UV-LED lamps consume about 80-90% less energy than a mercury based lamp. UV-LED lamps also operate at lower temperatures.

UV-curable inks have been printed in other products and on surfaces such as glass and have been used in security printing, among others. For example, CN103045007 describes a LED-UV silk-screen printing ink composition and preparation method of an ink composition. CN104497697 describes a LED-UV photocurable screen printing halogen-free glass ink. JP5564788B2 describes an activation energy belt hardening die screen ink and printed matter. CN104910679 describes an ultraviolet-cured rotary silk-screen printing ink with led as light source. JP2015010113A describes photocurable, moisture proof insulating coating.

It is believed that current UV-curable PTF dielectrics cannot be cured with LED lamps. If an ink composition for this application could be cured in this way, then printed electronic manufacturers would benefit from consuming less energy in manufacturing, lower operating temperatures, and from less harshly impacting the environment, for example, by employing an ozone- and mercury-free process. UV-LED lamps have much longer lifetimes than mercury lamps. For example, a UV-LED lamp may have a useful life of about 20,000 hours or more, compared to about 500-2000 hours for a mercury lamp. Also, less maintenance would have to be practiced, which further reduces costs.

There are commercially available UV-LED curable conformal coatings used in printed circuit board (PCB) manufacturing. These conformal coatings can be applied onto fully assembled PCBs to protect the electrical components of the boards against moisture, chemicals, dust, and the extremes of temperature. However, UV-LED conformal coatings should not be considered to be the same as or interchangeable with PTF dielectric inks and coatings, such as those described herein. Conformal coatings are applied in thick layers, for example in thicknesses of 40-250 microns (though 40-80 microns are more likely). Conformal coatings are applied by brush, spray coating, dipping or selective coating processes after the board is fully assembled. Such boards may have very complex components and often have very dense 3 dimensional assemblies. Due to the 3D nature of PCB assemblies, current UV-LED conformal coatings require a secondary curing step, such as by moisture curing or heat curing. This second cure step is required for proper function and operation of the PCBs. Conformal coatings are applied as one of the last steps in PCB manufacturing to provide protection to the copper circuitry, solder joints, conductive adhesive joints, and assembled components.

On the other hand, PTF dielectric coatings have a different role in electronic component structure and manufacturing. PTF dielectric coatings are typically applied by screen printing onto flexible substrates. PTF dielectric coatings are applied over, under, and in between printed conductive inks that, for example, may include silver or carbon as the conductive component. In this arrangement, PTF dielectric coatings serve as crossover dielectrics that enable the formation of multilayer circuitry, and/or as protective flexible PTF dielectric coatings over the silver conductive tracks before the circuits enter the component assembly process. PTF dielectric coatings have higher viscosities than conformal coatings and are printed at thinner ink films (most typically around 30 microns) than conformal coatings.

Dielectric inks and coatings that are employed in manufacturing printed electronics applications, such as polymer thick film (PTF) inks, are traditionally cured using mercury based UV lamps. As understood, no UV-LED curable dielectric inks and coatings are available in the market, and publications have not been found that disclose UV-LED compositions or compositions cured with UV-LED to form dielectric layers in manufacturing printed electronics applications.

SUMMARY OF THE INVENTION

The present disclosure is directed to UV-LED curable, dielectric inks and coatings that can be used in the manufacture of printed electronics such as, for example, membrane touch switches, capacitive and resistive touch sensors, printed antennas and other printed electronic components.

Described herein are UV-LED curable dielectric inks or coating compositions that include one or more acrylated oligomers, one or more acrylate monomers, and one or more photoinitiators, wherein the ink or coating composition is curable when exposed to energy from a UV-LED energy source. While the dielectric ink or coating composition may be applied to substrates by different printing techniques, such as flexo, gravure, and digital printing, the composition is particularly well suited for application by screen printing, which is the predominant application method in the field of printed electronic components.

Further described is a method of forming an electrical component. The method includes the steps of: screen printing onto a substrate one or more layers of a dielectric ink or coating composition that is curable with a UV-LED energy source that comprises one or more acrylated oligomers, one or more acrylated monomers; and one or more photoinitiators, and curing the layers of the dielectric ink or coating composition by exposing the layers to energy from a UV-LED energy source.

In a further aspect of the method, one or more layers of a conductive ink composition may be applied before or after (i.e. under, over, and/or under and over) printing and curing at least one of the one or more layers of the UV-LED dielectric inks.

Still further, described is a printed electronic component comprising a substrate of an electrical component and a screen printed layer on the substrate that comprises a UV-LED curable dielectric ink or coating composition, the composition comprising one or more acrylated oligomers, one or more acrylated monomers, and one or more photoinitiators, wherein the screen printed layer is cured by exposure to energy from a UV-LED energy source.

In yet another aspect, described is a multilayer conductive circuit comprising a substrate, and layers applied to the substrate in any arrangement of: one or more layers of conductive ink, and one or more screen printed layers of a UV-LED curable dielectric ink or coating composition comprised of one or more acrylated oligomers, one or more acrylated monomers, and one or more photoinitiators, wherein the one or more screen printed layers of the UV-LED curable dielectric ink or coating composition are cured by exposure to energy from a UV-LED energy source. In a further aspect, the multilayer conductive circuit is used in printed electronics applications.

In yet still another aspect, described is a conductive circuit comprising a substrate, one or more printed layers of conductive ink in which at least an upper layer of the conductive ink comprises silver, and one or more screen printed layers of a UV-LED curable dielectric ink or coating composition comprising one or more acrylated oligomers, one or more acrylated monomers, and one or more photoinitiators, wherein the screen printed layers of the UV-LED curable dielectric ink or coating composition have been cured by exposure to energy from a UV-LED energy source.

In a further related aspect, the conductive circuit is employed in a printed electronic component, as a membrane touch switch, a capacitive and resistive touch sensor, a printed antenna, various interconnects, printed flexible connector tails and other printed electronic components.

In one aspect of the UV-LED curable dielectric inks and coatings described herein, the photoinitiators present in the inks and coating compositions initiate a free radical polymerization reaction when exposed to the curing energy emitted by a UV-LED energy source. The photoinitiators present in the described inks and coating compositions are excited when exposed to energy at the emission wavelengths of a UV-LED energy source.

In one aspect, the described dielectric inks or coating compositions, when cured, exhibit one or both of a breakdown voltage that is greater than or equal to about 100 KV/mm and a volume resistivity that is greater than about $10^{12}$ ohm·cm.

In constructing a printed electronic part, a conductive ink such as a silver-containing conductive ink is printed on a plastic film substrate, such as polyester (e.g., polyethylene terephthalate (PET) and polyethylene naphthalate (PEN)), polyimides (PI), and other plastic substrates). One, two, or more layers of a dielectric ink or coating may then be printed on top of the conductive ink. Another layer of conductive ink, e.g., conductive silver ink, may then be printed over the dielectric ink layer to form a crossover or insulation point. Alternatively, dielectric ink can be applied before the conductive ink, such as applied directly to the substrate or after applying another coating layer, in order to protect the conductive circuitry (e.g., prevent silver tarnish) and increase the operating window for flexibility, environmental stability and wear of the conductive circuit or printed flexible circuit connector tail.

In addition to being screen printable and then curable with UV-LED energy, the disclosed dielectric inks and coatings provide good electrical insulation, as evidenced by volume resistance and breakdown voltage. The coatings further provide good adhesion to the films used in printed electronics (e.g., plastic films), and exhibit good flexibility (since printed electronics are often required to have high flexural endurance). Further, they are environmentally stabile in that they prevent printed circuit degradation over time.

The UV-LED curable dielectric inks and coatings described herein are advantageous in that a much more efficient curing procedure results because UV-LED curing consumes significantly less energy than mercury lamp-based curing. UV-LED curing emits less heat, and is more environmentally friendly than mercury lamp-based curing. Further, a UV-LED lamp has a longer useful life.

A further advantage of the UV-LED curable dielectric inks and coatings described herein, and of the processes of making components with same, is the increase in versatility over working with traditional PTF dielectrics, as the UV-LED curable dielectric inks and coatings described herein can be used in both UV-LED curing applications and also with traditional mercury curing lamps.

The above advantages and further advantages will become apparent from the following written description.

DETAILED DESCRIPTION OF THE INVENTION

Unless defined otherwise, all technical and scientific terms used herein have the same meaning as is commonly understood by one of skill in the art to which the inventions belong. All patents, patent applications, published applications and publications, websites and other published materials referred to throughout the entire disclosure herein, unless noted otherwise, are incorporated by reference in their entirety for any purpose.

In this application, the use of the singular includes the plural unless specifically stated otherwise. As used herein, the singular forms "a", "an" and "the" are intended to include the plural forms as well, unless the context clearly indicates otherwise.

As used herein, the use of "or" means "and/or" unless stated otherwise.

As used herein, the terms "comprises", "comprised of", and/or "comprising" specify the presence of stated features, integers, steps, operations, elements, and/or components, but do not preclude the presence or addition of one or more other features, integers, steps, operations, elements, components, and/or groups thereof. Furthermore, to the extent that the terms "includes", "having", "has", "with", "comprised", "form", "formed", or variants thereof are used in either the detailed description or the claims, such terms are intended to be inclusive in a manner similar to the term "comprising".

As used herein, ranges and amounts can be expressed as "about" a particular value or range. "About" is intended to also include the exact amount. Hence "about 5 percent"

means "about 5 percent" and also "5 percent". "About" means within typical experimental error for the application or purpose intended.

As used herein, "multifunctional" means having two or more functional groups. A multifunctional monomer, e.g., can be a di-functional, tri-functional, tetra-functional or have a higher number of functional groups. For example, a multifunctional acrylate includes diacrylates, triacrylates and tetraacrylates.

The present disclosure provides UV-LED curable dielectric inks and coating compositions for printed electronics applications that can be applied by screen printing and other application techniques. The dielectric inks and coatings provide effective insulation for the crossover conductive silver tracks and can also provide a protective dielectric layer for printed interconnects and printed flexible connector tails used in printed electronics. The UV-LED curable dielectric inks and coating compositions described herein exhibit good adhesion to various substrates, particularly plastic substrates that are used in printed electronics. The described inks and coatings have good flexibility, good insulation, and meet the requirements for printed electronic components. In addition, the dielectric inks and coatings can be cured by UV-LED energy sources and by standard mercury lamps, making them universally suited for the manufacture of printed electronics.

While the dielectric inks and coatings are well suited for application to substrates by screen printing, other printing processes can be employed. For example, the inks and coatings could be applied by other printing methods (e.g. flexo, gravure, digital, lithography, etc.). It should be understood that the inks and coating composition may have to be modified, such as in terms of the viscosity and rheological properties of the inks, to render them suitable for printing by the particular technique that will be used.

It is understood that the present invention encompasses both inks (containing one or more colorants) and coating, which are typically free of colorants.

The dielectric inks and coatings described herein comprise one or more UV-curable acrylate oligomers, one or more UV-curable acrylate monomers, and one or more photoinitiators that initiate a free radical polymerization reaction when exposed to a UV-LED energy source. Other components may be included in the dielectric inks and coatings, such as, for example, inert resins, additives, fillers, and colorants (e.g., pigments and dyes). The inks also contain other components, including, but not limited to, inert resins, fillers, defoamers, leveling agents, rheology modifiers, stabilizers, surfactants, and adhesion promoters.

Many kinds of UV-curable acrylate oligomers can be used in the described dielectric inks and coatings. The UV-curable acrylate oligomers should exhibit one or more of the following characteristics: excellent abrasion resistance, excellent solvent resistance, excellent flexibility, excellent adhesion to underlayers and substrates, excellent impact resistance, and compatibility with other components of the compositions.

Exemplary UV-curable acrylate oligomers include polyester acrylates, urethane acrylates, epoxy acrylates, mercapto-modified acrylates, and blends thereof. The oligomers preferably comprise 10-60 wt % of the total weight of the inks.

Polyester acrylate oligomers are preferably high flexibility and low shrinkage and exhibit good adhesion to various substrates. A merely exemplary list of polyester acrylate oligomers includes commercial products such as Ebecryl 411, Ebecryl 524, Ebecryl 812, available from Allnex; CN 2281 from Arkema/Sartomer; and UVP 6000, UVP 6010, UVP-6021, UVP 6150, UVP 6300 and UVP 6722 from Polymer Technologies.

While any urethane acrylate oligomer can be used in the dielectric inks and coatings of the present disclosure, it is preferred that the urethane acrylate oligomer be aliphatic (rather than aromatic), as it has been found that aliphatic urethane acrylate oligomers have physical properties well suited for inks and coatings, such as scratch resistance, scuff resistance, mar resistance, and good flexibility. Further, the aliphatic urethane acrylate oligomers are non-yellowing. Urethane methacrylate oligomers may also be used in the inks and coatings described herein.

Aromatic urethane acrylate oligomers may be used in the dielectric inks and coatings of the present disclosure and the inks will still exhibit a range of acceptable properties.

Exemplary aliphatic urethane acrylates that can be used in the dielectric inks and coatings include Photomer 6019, Photomer 6010, Photomer 6210, and Photomer 6184 from IGM Resins; Ebecryl 230, Ebecryl 242, Ebecryl 284 from Allnex; and CN 982, CN 962, CN 959 from Arkema/Sartomer. Also, urethane methacrylates, such as Genomer 4267 and Genomer 4256 from Rahn; and CN 1963 from Arkema/Sartomer, could be used.

The epoxy acrylates that can be used in the dielectric inks and coatings described herein exhibit good UV reactivity and good flexibility, so as to facilitate the chemical resistance of the printed layer in the printed electronic component. An exemplary list of epoxy acrylates includes Ebecryl 3201, Ebecryl 600, Ebecryl 3703, Ebecryl 3500, and Ebecryl 3701 from Allnex; and Genomer 2235, Genomer 2253, Genomer 2255 from Rahn.

Mercapto-modified acrylate oligomers can mitigate oxygen inhibition in the UV-LED curing process and result in better surface sure and overall ink properties. An exemplary list of mercapto-modified acrylate oligomers includes Ebecryl LED 02, Ebecryl 8416 from Allnex, Genomer 7302 from Rahn.

Combinations of different kinds of acrylate oligomers can be used in the present compositions.

The total amount of UV-curable acrylated oligomers that may be present in the in the described dielectric inks and coating compositions is about 10 wt % to about 60 wt %, preferably about 15 wt % to about 55 wt %, and more preferably about 20 wt % to about 50 wt %, based on the total weight of the composition.

The UV-curable acrylated monomers can be mono-functional and/or multi-functional; e.g., they can have one, two, three or more acrylate functional groups per molecule. Exemplary UV-curable monomers that may be present in the described dielectric inks and coating compositions include isobornyl acrylate, phenoxyethyl acrylate, tetrahydrofuran acrylate, N-vinylpyrrolidone, N-vinylcaprolactam, acryloyl morpholine, hydroxyethyl methacrylate, dicyclopentenyloxyethyl acrylate, tripropyleneglycol diacrylate, 1, 6-hexanediol diacrylate, neopentyl glycol diacrylate, n-hexyl acrylate, isooctyl acrylate, trimethylol propane triacrylate, pentaerythritol triacrylate, ethoxy or propoxy trimethylol propane acrylate, and combinations thereof.

The total amount of UV-curable acrylated monomers that may be present in the described dielectric inks and coating compositions is about 5 wt % to about 50 wt %, preferably about 10 wt % to about 40 wt %, more preferably about 15 wt % to about 35 wt %, based on the total weight of the composition.

The photoinitiators present in the described dielectric inks and coating compositions initiate a free radical polymerization reaction when exposed to a UV-LED energy source. Exemplary photoinitiators include acyl phosphorus oxides, benzophenones and derivatives thereof, alpha-amino ketone, alpha-hydroxy ketones, thioxanthones, and acrylated amine synergists. Preferably, the photoinitiator is one of or a combination of diphenyl(2,4,6-trimethylbenzoyl)phosphine oxide, phenyl bis(2,4,6-trimethylbenzoyl) phosphine oxide, isopropylthioxanthone, 1-hydroxy-cyclohexyl-phenyl ketone, 2-hydroxy-2-methyl-1-phenyl-Propanone, and 2-Benzyl-2-(dimethylamino)-1-[4-(morpholinyl) phenyl)]-1-butanone. One or more initiators from the above group can be used.

The total amount of photoinitiators that may be present in the in the described dielectric inks and coating compositions is about 1 wt % to about 15 wt %, preferably about 1.5 wt % to about 12 wt %, more preferably about 3 wt % to about 8 wt %, based on the total weight of the composition.

Different UV LED lamps have different emission wavelengths. With the described dielectric inks and coating compositions, it has been found that the emission wavelengths of the UV LED curing energy may be in the preferred range of about 355 nm to 415 nm, although other wavelengths that are above and below this range may be employed. An emission wavelength of about 395 nm has been found to be particularly well suited for providing a complete and effective cure. There may be instances in which the composition of the ink and coating composition may be modified in order to better utilize the energy of UV LED light at a given emission wavelength.

The described dielectric inks and coating compositions include optional ingredients. For example, an inert resin may be present in the ink and coating compositions. If present, an inert resin may be included in an amount of about 0.5 wt % to about 40 wt %, preferably about 1.0 wt % to about 30 wt %, and more preferably about 5 wt % to about 15 wt %, based on the total weight of the composition. Exemplary inert resins that may be included are homo- and co-polymers of polyesters, acrylates, methacrylates, epoxies, phenoxys, phenolics, ketones, and combinations thereof. It may be advantageous to include one or more inert resins in the dielectric ink and coating compositions, since they aid in dispersion, adhesion and cure response.

Should an inert resin be included, and should it be an acrylic resin, then preferably it is an inert acrylic homopolymer or an inert acrylic copolymer made from combinations of monomers including, but not limited to, (meth) acrylic acid, butyl (meth)acrylate, ethyl (meth)acrylate, methyl (meth)acrylate, styrene, acrylonitrile, (meth)acrylamide, and vinyl acetate.

The inks of the present invention may optionally contain fillers, such as, for example, talc, clay, silica, boron nitride, mica, and calcium carbonate. If present, fillers may be included in an amount of about 0.5 wt % to about 40 wt %, preferably about 1.0 wt % to about 30 wt %, and more preferably about 5 wt % to about 25 wt %, based on the total weight of the composition.

A colorant may be included in the described inks and coating compositions. Suitable colorants include organic or inorganic pigments and dyes. Exemplary dyes include fluorescent dyes, azo dyes, anthraquinone dyes, xanthene dyes, azine dyes, combinations thereof and the like. Organic pigments may be one or more pigments, such as for example Pigment Yellow Numbers 12, 13, 14, 17, 74, 83, 114, 126, 127, 174, 188; Pigment Red Numbers 2, 22, 23, 48:1, 48:2, 52, 52:1, 53, 57:1, 112, 122, 166, 170, 184, 202, 266, 269; Pigment Orange Numbers 5, 16, 34, 36; Pigment Blue Numbers 15, 15:3, 15:4; Pigment Violet Numbers 3, 23, 27; and/or Pigment Green Number 7. Exemplary inorganic pigments include iron oxides, titanium dioxides, chromium oxides, ferric ammonium ferrocyanides, ferric oxide blacks, Pigment Black Number 7 and/or Pigment White Numbers 6 and 7. Other organic and inorganic pigments and dyes can also be employed, as well as combinations that achieve the desired color.

Additives may be included in the inks and coating compositions in order to improve various properties. Exemplary additives include adhesion promoters, silicones, light stabilizers, de-gassing agents, waxes, flow promoters, defoamers, antioxidants, stabilizers, surfactants, dispersants, plasticizers, rheological additives, waxes, leveling agents, etc.

In fabricating printed electronic components, the described dielectric UV-LED curable inks and coatings may be applied in one or more layers. For example, the UV-LED dielectric ink and coating composition can be applied directly to the substrate. In another arrangement, a conductive ink composition can be applied before the dielectric ink and coating composition (e.g., be applied under the dielectric ink and coating composition). Additional layers of conductive and dielectric inks can then be applied, in order to provide crossover circuitry. The layers of the described dielectric UV-LED curable inks and coatings can be arranged to insulate and protect one or more layers of conductive inks, such as conductive silver inks, in order to form reliable circuits for printed electronics applications.

The substrates of the printed electrical components may be those that have been commonly used in this field. Among them are plastic films such as PET, PEN, polyimide, polycarbonate (PC), and thermoplastic polyurethane (TPU). For some printed electronic applications, paper and even synthetic papers can be used. The polymer thick film conductive silver or graphite ink is printed and cured on the substrate to form conductive tracks.

While silver-based conductive inks may be preferred, any kind of conductive ink can be used with the described UV-curable dielectric inks and coatings and in printed articles including same. Examples of other conductive inks include inks based particles of copper, silver coated copper, other metal alloys, carbon, graphite, indium tin oxide (ITO), Sb doped $SnO_2$ (ATO), conductive polymers, and combinations thereof.

In an aspect of the present disclosure, electrical components can be fabricated through printing techniques, such as screen printing, in which layers of conductive inks and the described dielectric UV-LED curable inks and coatings are deposited on the substrate and on top of each other, in a layering arrangement and/or patterns selected by the designer, fabricator, etc. of the electrical component. The conductive inks may contain conductive particles, such as particles of silver, carbon, and other conductive materials.

In one aspect, circuits are prepared by printing, e.g., screen printing, a layer of thermally curable PTF conductive silver ink composition, for example Sun Chemical AST6300, onto a plastic substrate and thermally curing the applied layer in an oven at a temperature, for example, in a range of 248-302° F. for about 5-30 minutes. The ink can be printed on hand, semi-automatic or fully automatic screen printing machines. Polyester or stainless screens with mesh count 255-355 threads/inch can be used depending on desired ink film thickness. Then one or more layers of the described UV-LED curable dielectric ink or coating composition is screen printed over the silver layer and cured by exposure to the energy emitted by a UV-LED lamp, such as a lamp available from Phoseon. Since defects in the dielectric layer may result in weaker insulation properties (or in some instances may result in a short circuit), it can be advantageous to apply more than one screen printed layer of UV-LED curable dielectric ink or coating composition over the conductive silver ink. In many instances, it is sufficient to screen print two layers over the silver conductive ink, and to cure each layer after its application, although more layers of dielectric may be applied. Another layer of conductive silver is then printed over the top of the dielectric to form a circuit crossover point.

A printed electronic component can be provided which includes a substrate, such as those of the materials described above, which are suitable for electrical components. Directly on the substrate or over the substrate a screen printed layer of the UV-LED curable dielectric ink or coating compositions described as herein is applied. The UV-LED curable dielectric ink or coating composition layers are cured, preferably individually after screen printing, by exposure to energy from a UV-LED energy source at a dose sufficient to cause curing, such as described above. Layers of conductive ink may be applied first (e.g., directly on the substrate), after (e.g., on top of a layer of a UV-LED curable dielectric ink or coating composition), before (e.g., under layer of a UV-LED curable dielectric ink or coating composition) and intermediate (e.g., between layers of UV-LED curable dielectric ink or coating compositions). The conductive ink may also be the top layer of the arrangement. In actuality, the layers of dielectric compositions and conductive ink compositions can be layered in any conceivable arrangement. The layers of conductive ink are also preferably cured, preferably individually after application, by a curing process that preferably includes a thermal cure. One or more layers of the described UV-LED curable dielectric ink or coating compositions may be applied and cured as indicated. One or more layers of the conductive ink may be applied and cured as indicated.

In one inventive aspect, the present disclosure is directed to circuits for printed electronics applications that include the described dielectric UV-LED curable inks and coatings.

In a further embodiment, the present invention is drawn to a process for manufacturing circuits for printed electronics applications, wherein the process comprises LED-curable dielectrics/coatings.

EXAMPLES

The principles of the present disclosure are demonstrated by the compositions and printed articles described in the following examples. The examples are not intended to limit the scope of the disclosure, and should not be construed to limit same.

Example 1

The composition of Example 1, within the scope of the present disclosure, is directed to a UV-LED curable screen ink containing urethane acrylate oligomer shown to be suited for use in printed electronics components. Table 1 shows the composition of the UV-LED dielectric by weight.

The photoinitiators were dissolved in a mixture of acrylate oligomer and monomer using a high speed mixer. The remaining components set forth in Table 1 were then added. Good and thorough mixing continued. The resulting mixture was milled in three-roll mill to <4 rating on NPIRI fineness of grind gauge.

TABLE 1

Composition of UV-LED Curable Screen Printable Dielectric of Example 1

| Component | Wt % |
|---|---|
| Elvacite 2013 - An acrylic resin - methacrylate copolymer (inert resin) | 10 |
| Photomer 6210 - an aliphatic urethane acrylate oligomer | 42 |
| 2-phenoxyethyl acrylate | 15 |
| ITX | 2 |
| Irgacure 369 | 3 |
| Tripropyleneglycol diacrylate | 5 |
| Silicone defoamer | 1.8 |
| Stabilizer | 0.5 |
| Phthalocyanine green pigment dispersion | 0.7 |
| Inorganic powder - talc | 20 |
| Total | 100.0 |

Irgacure 369: photoinitiator from BASF
ITX: Photoinitiator from IGM resins
Green pigment dispersion: phthalocyanine green dispersion from Sun Chemical.

A screen printed component comprising the dielectric ink and coating composition of Example 1 was prepared as follows. AST6300, a PTF silver ink available from Sun Chemical was printed in a serpentine pattern on a substrate (PET film Melinex ST505). Screen printing occurred through a 355 mesh polyester screen mesh. Thermal curing occurred at 300° F. for 10 minutes. Then, a first layer the Example 1 dielectric ink composition was printed over the silver conductive ink layer through a 305 mesh polyester screen and cured on a conveyor by exposure to the energy from a Phoseon UV-LED lamp emitting at a wavelength of 395 nm wavelength and an output of 8 W/cm$^2$. Conveyor speed was 50 ft/min. The dielectric was passed twice through the conveyor to provide an effective UV dose. After that, a second layer of the Example 1 dielectric ink composition was printed and cured in the same way as the first layer. Then, another silver conductive ink layer of AST6300 was screen printed on the dielectric layers in a serpentine pattern that is perpendicular to the first applied serpentine pattern. Screen printing and curing of this top layer of conductive silver ink was otherwise the same as the first applied conductive silver ink layer (e.g., through a 355 mesh screen and curing in an oven at 300° F. for 10 minutes). In this manner, printed articles are formed having a crossover or insulation point.

For comparison purposes, a screen printed component comprising the Example 1 composition and the same silver conductive ink composition was prepared as above, with the exception being that the Example 1 compositions were cured by exposure to the energy emitted by a median pressure mercury lamp available from American Ultraviolet Company. Output was 200 W/cm$^2$ and cure dose 600 mj/cm$^2$.

Adhesion and flexibility tests are performed on the circuits with crossover points. In addition, resistivity of the silver conductive layer is measured before and after application of dielectric ink to assure that the dielectric composition does not have a negative impact on electrical performance of conductive traces. The resulting circuits were tested for cross hatch tape adhesion using ASTM F1842-09 and bending and creasing using ASTM F1683-09. Resistance was measured before and after bending/creasing for each circuit. For comparison, comparative circuits were prepared in the same way, using Electrodag 452SS (Acheson), a commercially available UV PTF dielectric ink, instead of the dielectric ink composition of Example 1. The results are shown in Table 2.

TABLE 2

Flexibility And Adhesion Test on Printed Components For Example 1

| Dielectric and Curing Condition | Example 1, cured by UV-LED lamp 8 W/50 fpm/2 passes | | | | Example 1, cured by Hg lamp 200 W/50 fpm/2 passes | | | | Comparative Sample (Electrodag 452SS), cured by Hg lamp 200 W/50 fpm/2 passes | | | |
|---|---|---|---|---|---|---|---|---|---|---|---|---|
| | Bend | | Crease | | Bend | | Crease | | Bend | | Crease | |
| Circuit# | 1 | 2 | 3 | 4 | 5 | 6 | 7 | 8 | 9 | 10 | 11 | 12 |
| Resistance before testing, ohm | 41.45 | 39.35 | 32.78 | 30.85 | 32.58 | 32.94 | 43.70 | 44.90 | 37.70 | 37.25 | 34.52 | 33.30 |
| Resistance after 10 bend/crease, ohm | 42.60 | 40.50 | 34.98 | 32.98 | 32.73 | 34.06 | 44.88 | 48.25 | 38.75 | 37.90 | 35.73 | 37.20 |
| % Difference | 2.77 | 2.92 | 6.71 | 6.90 | 0.46 | 3.40 | 2.70 | 7.46 | 2.79 | 1.74 | 3.51 | 11.71 |
| % Difference average | 2.85 | | 6.81 | | 1.93 | | 5.08 | | 2.27 | | 7.61 | |
| [1]Adhesion Test 1, Silver/Dielectric/silver/PET | 0% Area Removed | | | | 0% Area Removed | | | | 0% Area Removed | | | |
| [1]Adhesion Test 2, Dielectric/Silver/PET | 0% Area Removed | | | | 0% Area Removed | | | | 0% Area Removed | | | |

[1]Adhesion was assessed and determined using the ASTM F1842-09 cross hatch tape adhesion test.

Adhesion test 1 is performed in a region of the printed article in which the silver layer is on top in the silver/dielectric/silver/PET layer structure. Adhesion test 2 is performed in a region in which the dielectric is on top in the dielectric/silver/PET layer structure.

To further evaluate the electric insulation properties of the UV-LED curable dielectrics, breakdown voltage was measured in accordance with ASTM D149, and volume resistivity was measured in accordance with the IPC-TM-650 test method. Copper clad FR-4 PCB was used as a substrate for testing the insulation properties of the described ink. In addition to testing the composition of Example 1, a further Example 2 dielectric ink composition within the scope of the present disclosure was prepared and tested. The composition of Example 2 is a UV-LED curable screen ink containing polyester acrylate oligomer and shown herein to be suitable for use in printed electronics components. Table 3 shows the composition of Example 2.

TABLE 3

Composition of UV-LED Curable Screen Dielectric of Example 2:

| Component | Wt. % |
|---|---|
| UVP6000-TP - A polyester acrylate oligomer | 50.0 |
| Irgacure 819 | 3.0 |
| ITX | 2.0 |
| Antioxidant | 0.2 |
| Propoxylated neopentylglycol diacrylate | 24.1 |
| Silicone defoamer | 1.0 |
| Stabilizer | 0.5 |
| Green pigment dispersion | 0.2 |
| Talc | 18.0 |
| Silica | 1.0 |
| Total | 100.0 |

Irgacure 819: photoinitiator from BASF
ITX: Photoinitiator from IGM resins
Green pigment dispersion: phthalocyanine green dispersion from Sun Chemical.

In preparing Example 2, the photoinitiators were dissolved in a mixture of acrylate oligomer and monomer by mixing with a high speed mixer. The remaining components in Table 3 were added, and good and thorough mixing continued. The resulting mixture was milled in a three-roll mill until the fineness of grind was equal or less than 4 on NPIRI gauge.

Crossover circuit testing for Example 2 was performed in the same manner as for Example 1 described above. The data is shown below in Table 4:

TABLE 4

Flexibility Test on Printed Components For Example 2

| Dielectric and Curing Condition | Example 2, cured by UV-LED lamp 8 W/50 fpm/2 passes | | | | Example 2, cured by Hg lamp 200 W/50 fpm/2 passes | | | | Comparative Sample (Electrodag 452SS), cured by Hg lamp 200 W/50 fpm/2 passes | | | |
|---|---|---|---|---|---|---|---|---|---|---|---|---|
| | Bend | | Crease | | Bend | | Crease | | Bend | | Crease | |
| Circuit# | 1 | 2 | 3 | 4 | 5 | 6 | 7 | 8 | 9 | 10 | 11 | 12 |
| Resistance before testing, ohm | 34.85 | 34.23 | 39.03 | 33.00 | 34.33 | 34.83 | 24.60 | 27.74 | 37.70 | 37.25 | 34.52 | 33.30 |

TABLE 4-continued

Flexibility Test on Printed Components For Example 2

|  | Example 2, cured by UV-LED lamp 8 W/50 fpm/2 passes | | | | Example 2, cured by Hg lamp 200 W/50 fpm/2 passes | | | | Comparative Sample (Electrodag 452SS), cured by Hg lamp 200 W/50 fpm/2 passes | | | |
|---|---|---|---|---|---|---|---|---|---|---|---|---|
| Dielectric and Curing | Bend | | Crease | | Bend | | Crease | | Bend | | Crease | |
| | Circuit# | | | | | | | | | | | |
| Condition | 1 | 2 | 3 | 4 | 5 | 6 | 7 | 8 | 9 | 10 | 11 | 12 |
| Resistance after 10 bend/crease, ohm | 35.35 | 34.68 | 40.32 | 34.42 | 34.97 | 35.49 | 25.19 | 31.25 | 38.75 | 37.90 | 35.73 | 37.20 |
| % Difference | 1.43 | 1.31 | 3.31 | 4.30 | 1.86 | 1.89 | 2.40 | 12.65 | 2.79 | 1.74 | 3.51 | 11.71 |
| % Difference average | 1.37 | | 3.81 | | 1.88 | | 7.53 | | 2.27 | | 7.61 | |

The Table 4 results for printed components including the UV-LED curable dielectric composition of Example 2 show that the UV-LED curable screen dielectrics as described herein, when cured by exposure to UV-LED curing energy, yield properties similar to that of a typical mercury lamp cured dielectric. The Example 2 dielectric compositions are suitable for printed electronics applications.

Table 4 also demonstrates that the composition of Example 2 can be cured by conventional mercury UV lamp, which is an additional benefit. The UV-LED curable dielectric of the present invention can be cured by both LED and conventional mercury UV lamps, yielding similar electric properties. The compositions are thus more adaptable for manufacturers, since they can be cured by mercury and LED UV lamps during printed article manufacturing.

Articles were prepared from the UV-LED dielectric compositions of Examples 1 and 2. Respectively, two layers of dielectric inks of the compositions of Example 1 and Example 2 were screen printed on copper clad with 200 mesh screen. Articles printed with the composition of Example 1 were cured by conventional mercury lamp or by UV-LED lamp; the same was done with articles printed with the composition of Example 2. For all articles, two layers of dielectric were printed to insure that there were no defects on the dielectric surface. For comparative purposes, articles were printed using a commercially available UV PTF Dielectric Electrodag 452SS (Acheson) and tested in the same manner as the compositions of Examples 1 and 2. The results are shown in Table 5.

ties (volume resistivity and breakdown voltage) that are desired for printed electronics applications. These exemplary compositions also exhibit other characteristics desired in printed materials (e.g., good adhesion, good flexibility). The properties exhibited by the compositions of Examples 1 and 2 are similar to those of a dielectric composition that has been cured by a mercury lamp, and thus are suited for being included in printed electronic component applications. The present compositions may also be cured by exposure to energy from a mercury lamp, as commonly used in this field.

Further, Table 5 shows that a conventional dielectric composition showed poor cure response when exposed to the curing energy of UV-LED energy source.

The present invention has been described in detail, including the preferred embodiments thereof. However, it will be appreciated that those skilled in the art, upon consideration of the present disclosure, may make modifications and/or improvements on this invention that fall within the scope and spirit of the invention.

What is claimed is:

1. A printed electronic component comprising:
   a substrate of an electrical component
   one or more screen printed layers on the substrate, wherein the one or more printed layers comprise a UV-LED curable dielectric ink or coating composition comprising:
   about 20 wt % to about 60 wt % of one or more oligomers selected from the group consisting of polyester acrylate oligomers, urethane acrylate oli-

TABLE 5

Electric Properties of Dielectrics

| Dielectric Cure condition | Example 1 Hg lamp 200 W/ 50 fpm/2 passes | Example 1 LED lamp 8 W/ 50 fpm/2 passes | Example 2 Hg lamp 200 W/ 50 fpm/2 passes | Example 2 LED lamp 8 W/ 50 fpm/2 passes | Comparative Sample (Electroda g452SS) Hg lamp 200 W/ 50 fpm/2 passes | Comparative Sample (Electroda g452SS) LED lamp 8 W/ 50 fpm/10 passes |
|---|---|---|---|---|---|---|
| Volume Resistivity, (ohm · cm) | >$10^{12}$ | >$10^{12}$ | >$10^{12}$ | >$10^{12}$ | >$10^{12}$ | NA* |
| Breakdown voltage, (KV/mm) | >100 | >100 | >100 | >100 | >100 | NA* |

*the comparative dielectric did not cure by LED lamp, the ink was still wet after being passed 10 times under the lamp.

The results shown in Tables 2, 4 and 5 demonstrate that the UV-LED curable screen printed dielectric inks and coating compositions of the present disclosure, as exemplified by Examples 1 and 2, can be cured by exposure to UV-LED energy and that they exhibit the dielectric propergomers, epoxy acrylate oligomers, mercapto-modified acrylate oligomers, and blends thereof;
one or more monomers selected from the group consisting of mono-, di-, tri-functional acrylate monomers, and polyfunctional acrylate monomers having more than 3 acrylate functional groups and combinations thereof, wherein each functional group capable of undergoing free radical polymerization that is present on each monomer is an acrylate group; and one or more photoinitiators;

wherein the ink or coating composition has been cured by exposure to energy from a UV-LED energy source.

2. The printed electronic component of claim 1, wherein the one or more monomers are present in the dielectric ink or coating composition in an amount of from about 5 wt % to about 50 wt %, based on the total weight of the dielectric ink or coating composition.

3. The printed electronic component of claim 1, wherein the one or more photoinitiators are present in the dielectric ink or coating composition in an amount of from about 1 wt % to about 15 wt %, based on the total weight of the dielectric ink or coating composition.

4. The printed electronic component of claim 1, wherein the one or more photoinitiators are selected from the group consisting of acyl phosphine oxides, alpha-amino ketones, thioxanthone derivatives, and mixtures thereof.

5. The printed electronic component of claim 1, wherein the dielectric ink or coating composition further comprises a component selected from the group consisting of one or more inert resins, one or more fillers, one or more additives, one or more colorants, and combinations thereof;

wherein, when present, the one or more inert resins are present in the dielectric ink or coating composition in an amount of from about 0.5 wt % to about 40 wt %; based on the total weight of the dielectric ink or coating composition; and/or wherein, when present, the one or more fillers are present in the dielectric ink or coating composition in an amount of from about 0.5 wt % to about 40 wt %, based on the total weight of the dielectric ink or coating composition.

6. The printed electronic component of claim 5, wherein the one or more fillers are selected from the group consisting of talc, clay, silica, boron nitride, mica, calcium carbonate, and mixtures thereof.

7. The printed electronic component of claim 5, wherein the one or more additives are selected from the group consisting of rheology modifiers, adhesion promoters, waxes, matting agents, defoamers, surfactants, leveling agents, and mixtures thereof.

8. The printed electronic component of claim 1, wherein the dielectric ink or coating composition further comprises an amine synergist and/or wherein the dielectric ink or coating composition has been cured by exposure to UV-LED energy emission wavelengths in the range of from about 355 nm to about 415 nm.

9. The printed electronic component of claim 1, wherein the ink or coating composition exhibits one or both of a breakdown voltage that is equal or greater than about 100 KV/mm and a volume resistivity that is greater than about $10^{12}$ ohm/cm.

10. A method of forming an electrical component, comprising the steps of:

screen printing onto a substrate one or more layers of a dielectric ink or coating composition comprising:

about 20 wt % to about 60 wt % of one or more oligomers selected from the group consisting of polyester acrylate oligomers, urethane acrylate oligomers, epoxy acrylate oligomers, mercapto-modified acrylate oligomers, and blends thereof;

one or more monomers selected from the group consisting of mono-, di-, tri-functional acrylate monomers, and polyfunctional acrylate monomers having more than 3 acrylate functional groups and combinations thereof, wherein each functional group capable of undergoing free radical polymerizationon that is present on each monomer is an acrylate group; and one or more photoinitiators; and curing the layers of the dielectric ink or coating composition by exposing the layers to energy from a UV-LED energy source.

11. The method of claim 10, further comprising applying one or more layers of a conductive composition before printing, after printing, and/or before and after printing at least one of the one or more layers of the dielectric ink or coating composition.

12. The method of claim 10, wherein the conductive composition is a conductive ink based on silver, particles of copper, silver coated copper, carbon, graphite, conductive polymers, and combinations thereof.

13. A printed electronic component comprising a multilayer conductive circuit, wherein the multilayer conductive circuit comprises:

a substrate of an electrical component; and screen printed layers applied to the substrate in any layer arrangement of:

one or more layers of conductive ink, and one or more printed layers of the dielectric ink or coating composition according claim 1 that have been cured by exposure to energy from a UV-LED energy source.

14. A printed electronic component comprising a conductive circuit, wherein the conductive circuit comprises:

a substrate of an electrical component;

one or more printed layers of conductive ink, wherein at least an upper layer of the conductive ink comprises silver; and one or more printed layers of the dielectric ink or coating composition according claim 1 that are screen printed over the upper layer of conductive ink and which have been cured by exposure to energy from a UV-LED energy source.

15. The printed electronic component of claim 1, wherein the substrate of the electrical component is flexible.

16. The printed electronic component of claim 1, wherein the dielectric ink or coating contains no acrylated amines.

17. The printed electronic component of claim 1, further comprising a printed and cured layer of a conductive ink.

18. The printed electronic component of claim 16, wherein the conductive ink is based on silver, particles of copper, silver coated copper, carbon, graphite, conductive polymers, and combinations thereof.

19. The printed electronic component of claim 1, wherein the electronic component is not a printed circuit board.

* * * * *